United States Patent [19]

Harvey

[11] Patent Number: 5,179,355

[45] Date of Patent: Jan. 12, 1993

[54] SLEW CONTROL IN CURRENT FEEDBACK AMPLIFIERS

[75] Inventor: Barry Harvey, Los Altos, Calif.

[73] Assignee: Elantec, Milpitas, Calif.

[21] Appl. No.: 793,641

[22] Filed: Nov. 18, 1991

[51] Int. Cl.⁵ .............................................. H03F 3/26
[52] U.S. Cl. ..................................... 330/265; 330/267
[58] Field of Search .................. 330/9, 263, 265, 267, 330/268, 288, 293, 291, 311

[56] References Cited

U.S. PATENT DOCUMENTS 4,502,020  2/1985  Nelson et al. ........................ 330/265
4,833,423  5/1989  Molloy .............................. 330/265
4,888,559  12/1989  Sevenhams et al. ............ 330/265 X Primary Examiner—Steven Mottola
Attorney, Agent, or Firm—A. C. Smith

[57] ABSTRACT

A current feedback circuit for controlling the error current in current feedback amplifier includes transistor biasing circuitry which monitors the error current to detect high input signal slew rates and switches on a transistor controlled shunt circuit to divert drive current from the transistors forming the amplifier input, when the error current generated exceeds a threshold value.

3 Claims, 2 Drawing Sheets

SLEW CONTROL IN CURRENT FEEDBACK AMPLIFIERS

FIELD OF THE INVENTION

This invention relates to a circuit which controls the error current generated in a rapidly slewing current feedback amplifier to limit transient current levels within the circuit.

BACKGROUND OF THE INVENTION

Current feedback amplifiers, like operational amplifiers (op-amps) in general, are used extensively in control, computation, and measurement applications. Their principle advantage is that a feedback circuit is used to produce an output signal which is largely free of distortion and non-linearity.

A current feedback amplifier operates by generating an error current in response to a difference between the voltage applied to the amplifier input and a divided portion of the voltage on the amplifier output. The error current is then used to adjust the output voltage of the amplifier in the direction that eliminates this voltage difference. This is accomplished by using a voltage divider feedback circuit in the following manner.

A replica of the input voltage, $V_I(\text{ref})$, is applied to the lower leg of the voltage divider feedback circuit, creating an input reference point. The upper leg of the divider feedback circuit is connected to the amplifier output. For a given output voltage, $V_0$, error current flows into or out of the feedback circuit through the reference point when $V_I(\text{ref})$ deviates from the divided voltage, $V_0 R_G/(R_F + R_G)$, where $R_F$ and $R_G$ are the impedances in the upper and lower legs of the feedback divider circuit. The divided voltage is just the voltage that would exist at the lower leg of the feedback circuit for a given $V_0$ if the feedback circuit was disconnected from the reference point.

The error current so generated charges a capacitor which changes $V_0$. Error current continues to flow until:

$$V_0 = V_I(\text{ref})(1 + R_F/R_G). \qquad (I)$$

at which time the error current falls to zero and the output voltage ceases to change. The overall gain or amplification of the current feedback amplifier is determined by the ratio of the impedance in voltage divider feedback circuit.

A major problem with the operation of current feedback amplifiers is that capacitive effects in the amplifier circuit limit the rate at which the output can slew to follow an input. When this occurs, the difference between the divided voltage, $V_0 R_G/(R_F + R_G)$ and $V_I(\text{ref})$ generates error currents which can be large enough to saturate transistors in the input and subsequent stages of the amplifier circuit. If such transistors are saturated, any further increase in the voltage difference between the input and reference point will not generate larger error currents, as should happen for ideal amplifier behavior. Rather, the voltage at the amplifier output will slew at a rate determined by the maximum current of the saturated transistor, whose slew rate will be less than the slew rate of the signal voltage at the amplifier input. As a result, the amplifier will generate an output signal which is distorted relative to the input signal applied to the circuit and will exhibit saturation and recovery transients after the input signal is over.

SUMMARY OF THE INVENTION

The present invention uses a second feedback circuit to control the error current in a current feedback amplifier and reduce the distortion of amplified output signals. The second feedback circuit employs transistor switches which are biased into conduction by the large error current generated when an input signal slews more rapidly than the rate at which the current feedback amplifier circuit can respond. When activated, a transistor switch drains drive current from the corresponding input transistor of the amplifier, reducing its slew rate until the amplifier output has had time to respond at an acceptable rate to the input signal.

DETAILED DESCRIPTION OF THE INVENTION

Figure 1:
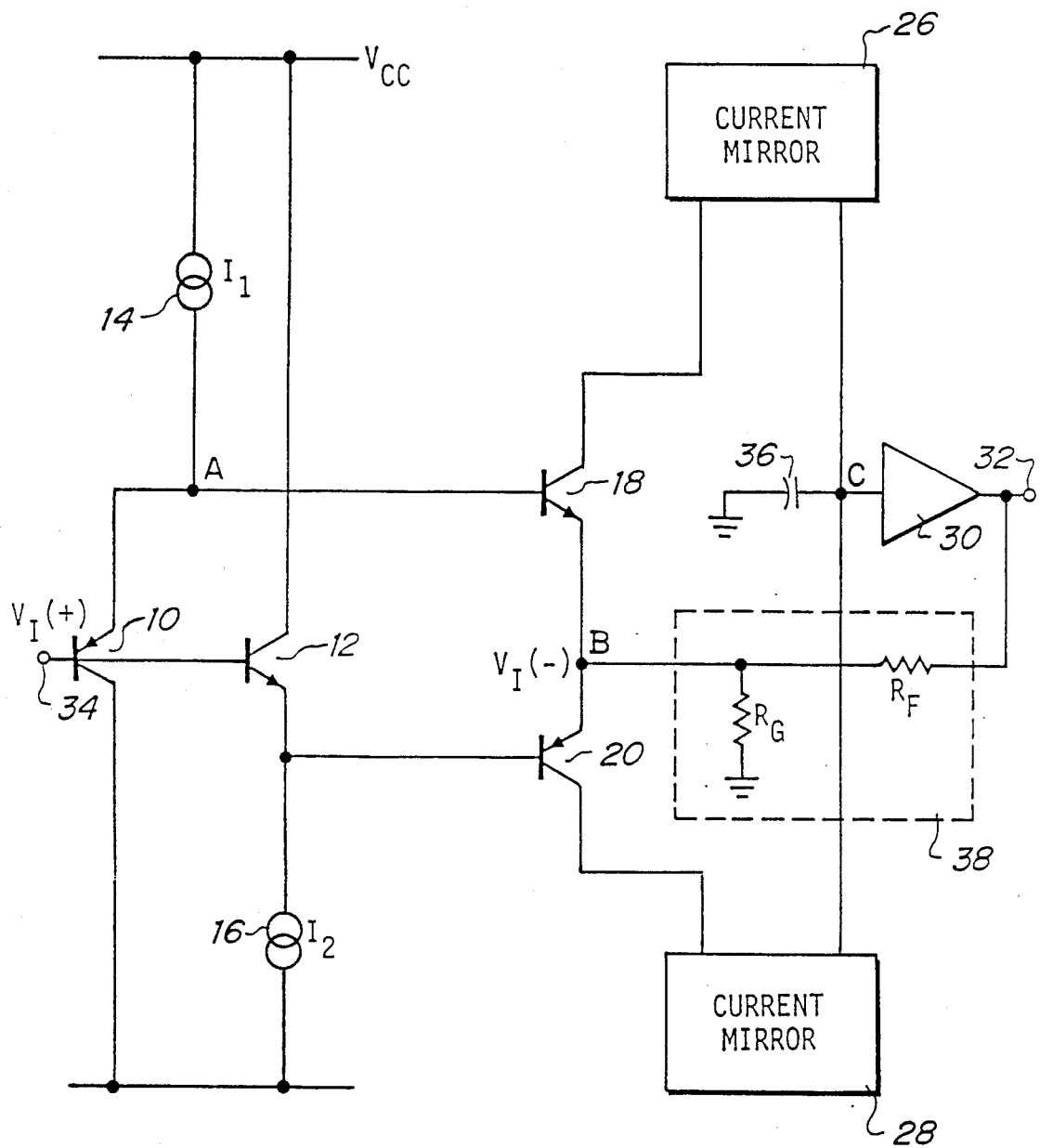
FIG. 1 is a block diagram of a conventional current feedback circuit.

Referring to FIG. 1, there is shown a typical current feedback amplifier circuit. Four transistors 10, 12, 18, 20 operate as complementary buffers. The bases of the first pair of complementary transistors 10, 12 serve as the input 34 for the amplifier. Each of the second pair of complementary transistors 18, 20 is also complementary to the transistor 10, 12 of the first pair to which it is connected. Current sources 14, 16 provide the drive current necessary to bias the first pair of transistors 10, 12 into conduction. The transistors 10, 12, 18, 20 provide a replica of the voltage at the amplifier input 34 to a reference point B, which is the junction of the emitters of the second pair of complementary transistors 18, 20. This insures that the voltage at point B, $V_I(B)$, is approximately equal to the voltage at the amplifier input 34, VI.

A feedback circuit 38 provides a divided portion of the voltage at the amplifier output 32 to the reference point B. No error current flows into or out of the feedback circuit 38 through the reference point B, as long as the output voltage, $V_0$ and $V_I(B)$ are related by the voltage divider equation, (I).

A pair of current mirrors 26, 28 operates in conjunction with the complementary transistors 18, 20. Current mirror 26 replicates the current flowing in the collector of transistor 18 and sources the replicated current to a node C, which is the junction formed by the input of a unity gain buffer 30, one terminal of a capacitor 36, and the outputs of the current mirrors 26, 28. The second current mirror 28 sinks a replica of the current flowing in the collector of transistor 20. Thus, with no error current flowing into or out of the feedback circuit 38 through point B, the collector currents in transistors 18, 20 are equal and the replicated current sourced by the current mirror 26 equals the replicated current which is sunk by the current mirror 28. As a result, the net current into node C is zero and the voltage on the capacitor 26, which is connected between the input of the unity gain amplifier 30 and ground, is not changed.

Error currents are generated in a current feedback amplifier whenever the voltage at the amplifier input 34 changes rapidly $V_I(B)$ since $V_0$ can not instantaneously change in accordance with equation (I). For a positive slewing input signal, current flows from point B into the feedback circuit 38. In this case, the collector current in transistor 18 is greater than the collector current in transistor 20 by an amount corresponding to one half of the error current. Consequently, the current sourced to the capacitor 36 by current mirror 26 exceeds the current which is sunk by the current mirror 28 and a net current equal to the error current flows into the node C. This current charges the capacitor 36 which slews the amplifier output 32 until $V_0$ is established at $(1+R_F/R_G)V_I(B)$. At this point, no more current will flow between point B and the feedback circuit 38 until the input slews $V_I(B)$ again. Under normal operation, the changes in $V_I(B)$, $V_0$, and the error current are continuous.

Because the voltage on capacitor 36 cannot be slewed instantaneously, error currents can be very large when $V_I(B)$ slews rapidly and distortion of the output signal during recovery of the circuit may result.

Figure 2:
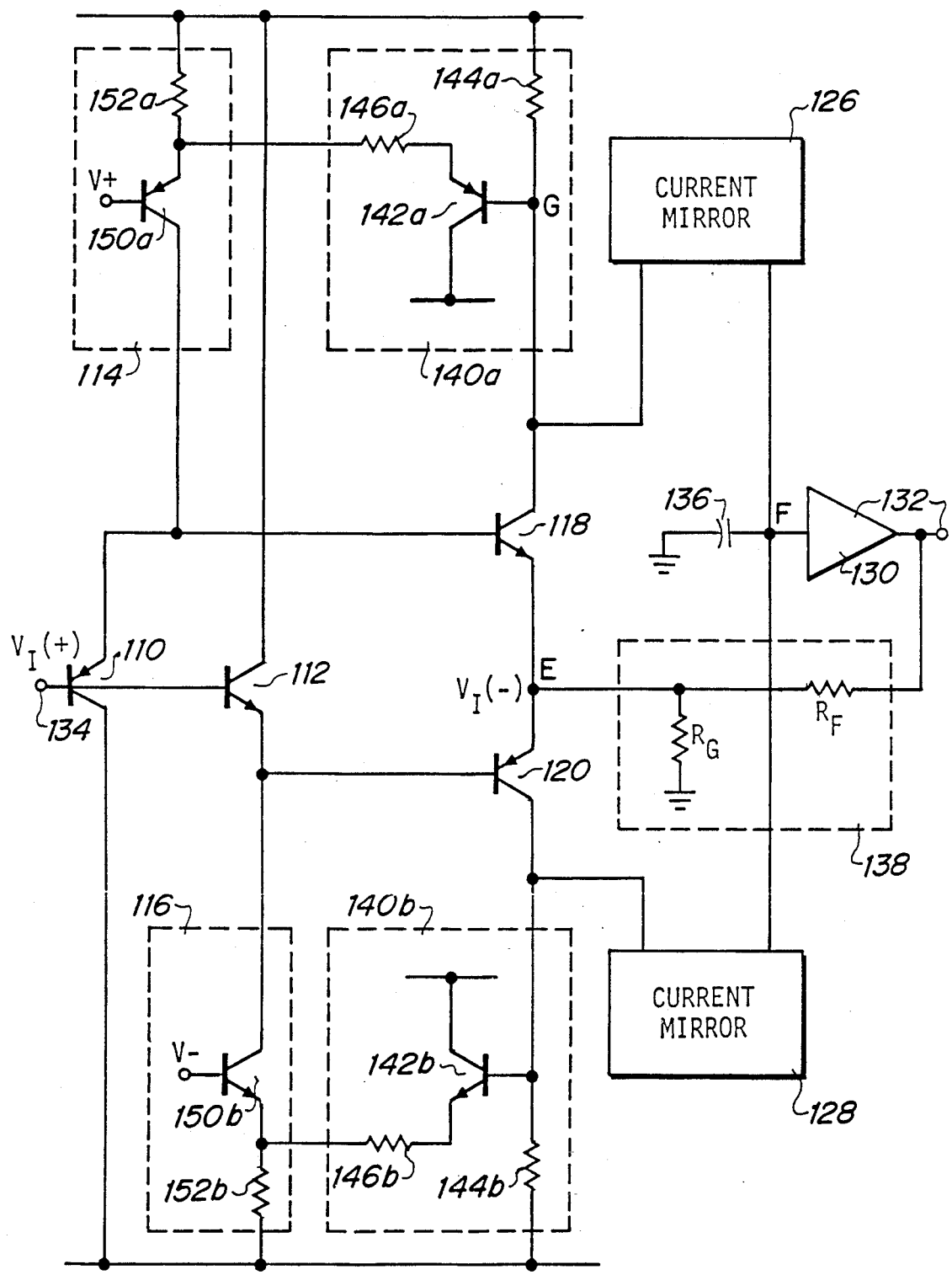
FIG. 2 is a diagram of the preferred embodiment of the present invention.

Referring to FIG. 2, there is shown a detailed diagram of the preferred embodiment of the present invention. A first pair of complementary transistors 110, 112 operates in conjunction with a second pair of complementary transistors 118, 120 to maintain a reference point E at a voltage $V_I(E)$ which approximately equals the voltage at the amplifier input 134. The base of the npn transistor 112 is connected to the amplifier input 134, its collector is connected to a positive voltage supply, and its emitter is connected to a current source 116. Similarly, the base of pnp transistor 110 is connected to the amplifier input 134, its collector is connected to a negative voltage supply and its emitter is connected to a current source 114.

The transistors 118, 120 are complementary to each other as well as to the first pair of transistors 110, 112. Thus, the npn transistor 118 has its base connected to the emitter of the pnp transistor 110, its emitter connected to the output of the feedback circuit 138 and its collector connected to the inputs of a current mirror 126 and an error current sensing circuit 140a. Similarly, the pnp transistor 120 has its base connected to the emitter of the npn transistor 112, its emitter connected to the output of the feedback circuit 138 and its collector connected to the inputs of a current mirror 128 and an error current sensing circuit 140b.

The error current sensing circuit 140a comprises a pnp transistor 142a having its emitter connected to the current source 114 through a resistor 146a, its base connected to one terminal of a current sensing resistor 144a, and its collector connected to a negative voltage supply. A complementary error current sensing circuit 140b comprises an npn transistor 142b a resistor 146b, its base having its emitter connected to the current source 116 through current sensing resistor 144b and its collector connected to the positive voltage supply.

Current mirrors 126 and 128 sense the voltage drops on 144a and 144b, respectively, and produce an output current proportional to the voltage drop on 144a and 144b which is proportional to the current to be mirrored. In essence, 144a and 144b are elements within mirrors 126 and 128.

The outputs of the complementary current mirrors 126, 128 are connected to one terminal of a capacitor 136 and to the input of a unity gain amplifier 130 at a circuit node F. The second terminal of the capacitor 136 is grounded. The output 132 of the unity gain amplifier 130, which is the output of the current feedback amplifier, is connected to point E via the feedback circuit 138.

The feedback circuit 138 comprises a resistor 142 between the amplifier output 132 and the point E, and a second resistor 144 connected between the point E and ground.

In the preferred embodiment, the current source 114 comprises a pnp transistor 150a having its base connected to a positive voltage input, $V_+$, its emitter connected to the positive voltage supply, $V_{cc}$ through a resistor 152a and its collector connected to the emitter of the transistor 110. Similarly, the current source 116 comprises an npn transistor 150b having its base connected to a negative voltage supply, $V_-$, its emitter connected to the negative voltage supply through a resistor 152b, and its collector connected to the emitter of the transistor 112. The positive and negative voltage inputs for the current sources 114, 116 can be derived from the positive and negative voltage supplies of the circuit. The error current sensing circuits 140a, 140b are connected to the current sources 114, 116 at the emitters of the corresponding transistors 150a, 150b.

As described above, when an input signal slews $VI(+)$ so that $V_0$ is no longer related to $V_I(+)$ by equation (I), error current flows into or out of the feedback circuit 138, creating a difference in the collector currents of the second pair of complementary transistors 118, 120. This difference, which is reflected in the currents sourced and sunk by current mirrors 126, 128, creates a net current (the error current) into or out of the node F, which charges the capacitor 136 at a slew rate given by the formula:

$$dV/dt = I_e/C. \qquad (II)$$

Here, $I_e$ is the error current and C is the capacitance of the capacitor 136.

The voltage on the capacitor 136 is buffered to the amplifier output 132 by the unity gain amplifier 130. The change in $V_0$ is in a direction that restores the relationship, by equation (I), between $V_0$ and $V_I(+)$ and thus reduces the error current.

When an input voltage slews point E rapidly, the error current increases as the slower slew rate of $V_0$ limits its ability to follow $V_I(+)$. In the case of a positive slewing input signal, the voltage drop across the resistor 144a increases with the error current, driving point G to lower voltages. The current monitoring transistor 142a turns on if the voltage drop created by error current flowing through the resistor 144a is sufficient to drive the point G below the emitter voltage of the transistor 142a. The error current at which the current monitoring transistor 142a turns on is determined by choosing a value for the resistor 144a which provides sufficient voltage drop to bias the current monitoring transistor 142a into conduction at the desired maximum error current.

When turned on, the transistor 142a provides a low impedance path between the resistor 154a and the negative supply voltage through which drive current can be diverted from the transistor 110. The loss of drive current limits the rate at which the emitter of transistor 110 and, consequently, $V_I(E)$ can be slewed. This allows $V_0$, which continues to be slewed by a controlled error current, to approach $V_I(E) \cdot (R_G+R_F)/R_G$. As the difference between $V_I(E) \cdot (R_G+R_F)/R_G$ and $V_0$ diminishes, the error current is reduced below the value necessary to turn on the transistor 142a. With the current monitor transistor 142a shut off, drive current returns to the transistor 110, allowing point E to slew once again in response to the slewing input signal. In sum, the rate at which the emitter of transistor 110 slews is prevented from rising faster than the amplifier output 134 can follow it with moderate error currents. For negative slewing signals, the complementary circuit using current source 116 and current monitoring circuit 140b is operative.

In accordance with the present invention, large error currents generated by rapid input signal slew rates trigger one of the current monitor circuits 140a, 140b, depending on whether the input signal is slewing positively or negatively. The current monitor circuits 140a, 140b include transistors 142a, 142b which divert drive current away from their corresponding transistors 110, 112 when turned on. The loss of drive current prevents the implicated transistor 110, 112 from following the slewing input signal until the error current has slewed the amplifier output voltage, $V_0$, to reduce the difference between $V_0$ and $V_I(E) \cdot (R_G+R_F)/R_G$. As $V_0$ approaches $V_I(E) \cdot (R_G+R_F)/R_G$, the error current flowing in the implicated current monitor circuit 140a, 140b is reduced, shutting off the corresponding transistor 142a, 142b and redirecting drive current back to the appropriate input buffer transistor 110, 112. This eliminates large, transient error currents within the amplifier circuit and the subsequent signal distortion.

I claim:

1. A current feedback amplifier circuit comprising:
   first and second pairs of complementary transistors, the bases of said first pair of transistors forming the input of said current feedback amplifier, the base of each of said second pair of transistors being connected to the emitter of the complementary transistor of said first pair of transistors, and the emitters of said second pair of transistors being connected to a reference point, for replicating the voltage applied to said amplifier input at said reference point;
   a pair of current sources each of said current sources being connected to the emitter of one of the transistors of said first pair of transistors, for supplying drive current to said first pair of transistors;
   a pair of current mirrors, each current mirror having its input connected to the collector of one transistor of said second pair of transistors and having its output connected to the input of a unity gain amplifier, for replicating the current flowing in the collectors of each of said second pair of transistors;
   a capacitor connected between the input of said unity gain amplifier and a reference potential, for controlling the voltage rate of change at the input of said unity gain amplifier when the collector currents of said second pair of transistors are unequal;
   a feedback circuit comprising a first impedance connected between the output of said unity gain amplifier and said reference point and a second impedance connected between said reference point and said reference potential, for providing a divided sample of the output voltage of said unity gain amplifier to said reference point; and
   a pair of current monitoring circuits, each of said current monitoring circuits being connected between the collector of one transistor of said second pair of transistors and the current source driving the corresponding transistor of said first pair of transistors, for detecting the error current flowing in the collectors of said second transistor pair and reducing the drive current to the corresponding transistor of said first transistor pair when said error current reaches a pre-selected level.

2. The circuit of claim 1, wherein each of said current monitoring circuits comprises;
   a current monitoring transistor including base, collector, and emitter electrodes and having its base electrode connected to the collector electrode of one of said second pair of transistors, its emitter electrode connected through a resistor to the current source which provides drive current to the corresponding transistor of said first pair of transistors, and its collector electrode connected to a voltage supply; and,
   an error current resistor having one terminal connected to said voltage supply and having a second terminal connected to the base of said current monitoring transistor and to the collector of the corresponding transistor of said second pair of transistors, for biasing said current monitoring transistors into conduction when the error current reaches a pre-selected value.

3. The circuit of claim 2, wherein each of said current sources comprises;
   a current source transistor including base, emitter, and collector electrodes and having its emitter electrode connected to a voltage supply through a current source resistor, its collector electrode connected to the emitter electrode of one of said first pair of complementary transistors, and its base electrode connected to a second voltage supply to bias said current source into conduction.

* * * * *